United States Patent
Ohmi et al.

(10) Patent No.: US 6,646,352 B2
(45) Date of Patent: Nov. 11, 2003

(54) GATE ELECTRODE COMPRISING BODY CENTERED CUBIC TANTALUM AND TANTALUM NITRIDE

(75) Inventors: Tadahiro Ohmi, 2-1-17-301, Komegahukuro, Aoba-ku, Sendai-shi, Miyagi-ken 980-0813 (JP); Hiroyuki Shimada, Kofu (JP)

(73) Assignees: Seiko Epson Corporation, Tokyo (JP); Tadahiro Ohmi, Miyagi-ken (JP)

( * ) Notice: Subject to any disclaimer, the term of this patent is extended or adjusted under 35 U.S.C. 154(b) by 0 days.

(21) Appl. No.: 09/834,993

(22) Filed: Apr. 12, 2001

(65) Prior Publication Data

US 2002/0020861 A1 Feb. 21, 2002

(30) Foreign Application Priority Data

Apr. 13, 2000 (JP) .................................... 2000-112222

(51) Int. Cl.[7] .............................................. H01L 23/48
(52) U.S. Cl. ...................... 257/763; 257/750; 438/685
(58) Field of Search ............................ 257/59, 72, 350, 257/320, 268, 750, 763; 438/149, 151, 685

(56) References Cited

U.S. PATENT DOCUMENTS

| 4,000,055 | A | * | 12/1976 | Kumagai | 204/192 |
|---|---|---|---|---|---|
| 5,625,217 | A | | 4/1997 | Chau et al. | 257/412 |
| 5,807,770 | A | * | 9/1998 | Mineji | 438/151 |
| 6,027,961 | A | | 2/2000 | Maiti et al. | 438/199 |
| 6,225,168 | B1 | | 5/2001 | Gardner et al. | 438/287 |
| 6,380,011 | B1 | | 4/2002 | Yamazaki et al. | 438/163 |
| 6,399,960 | B1 | * | 6/2002 | Yamazaki et al. | 257/59 |
| 2001/0018137 | A1 | * | 8/2001 | Chiang et al. | 428/698 |

FOREIGN PATENT DOCUMENTS

| JP | 61-117868 | 6/1986 |
|---|---|---|
| JP | 61-127124 | 6/1986 |
| JP | 10-233505 | 9/1998 |
| JP | 11-168212 | 6/1999 |

OTHER PUBLICATIONS

U.S. patent application Ser. No. 09/834,992, Ohmi et al., filed Apr. 12, 2001.

Hwang, et al. Novel Polysilicon/TiN Stacked–Gate Structure for Fully–Depleted SOI/CMOS, IEDM Technical Digest 1992, pp. 345–348.

Ushiki, et al. Reliable Tantalum Gate Fully–Depleted–SOI MOSFET's with 0.15μm Gate Length by Low–Temperature Processing below 500° C., IEDM Technical Digest 1996, pp. 117–120.

Shimada, et al. Low Resistivity PVD TaNx/Ta/TaNx Stacked Metal Gate CMOS Technology Using Self–Grown bcc–Phased Tantalum on TaNx Buffer Layer.

* cited by examiner

*Primary Examiner*—Richard Elms
*Assistant Examiner*—Brad Smith
(74) *Attorney, Agent, or Firm*—Hogan & Hartson, LLP

(57) ABSTRACT

A semiconductor device having an NMOSFET and a PMOSFET. Each MOSFET comprises first and second impurity diffusion layers for forming a source region and a drain region which are formed in a silicon layer of an SOI substrate or the like; a channel region formed between the first and second impurity diffusion layers; a gate insulating layer formed at least on the channel region; and a gate electrode formed on the gate insulating layer. The gate electrode includes a tantalum nitride layer formed in a region in contact with at least the gate insulating layer and a tantalum layer formed over the tantalum nitride layer. The tantalum layer may have a body-centered cubic crystal structure. The semiconductor device exhibits high current drive capability and can be fabricated at high yield.

16 Claims, 10 Drawing Sheets

GATE ELECTRODE COMPRISING BODY CENTERED CUBIC TANTALUM AND TANTALUM NITRIDE

BACKGROUND OF THE INVENTION

1. Field of the Invention

The present invention relates to a semiconductor device and a method of fabricating the same. More particularly, the present invention relates to an insulated gate field effect transistor characterized by its gate electrode, and to a method of fabricating the same.

2. Description of Related Art

In insulated gate field effect transistors used for current semiconductor integrated circuits, a polycrystalline silicon layer doped with high concentration of impurities is generally used as a gate electrode in order to decrease the resistance. In a semiconductor process used for CMOS circuits (Complimentary MOSFET circuits), N-type polycrystalline silicon and P-type polycrystalline silicon are respectively used for an N-channel MOSFET (NMOSFET) and a P-channel MOSFET (PMOSFET) as gate electrode materials for balancing the characteristics. Generally, a high-melting-point metal silicide layer is formed in the upper layer of the gate electrode in order to further decrease the resistance.

However, depletion occurs in the polysilicon layer of the gate electrode although the polysilicon layer is doped with high concentration of impurities. Occurrence of depletion is equivalent to the condition in which a capacitance is inserted into the gate electrode in series, thereby decreasing an effective electric field applied to a channel. As a result, the current drive capability of the MOSFET decreases. It is difficult to decrease the resistance of the entire gate electrode to 5 $\Omega/\square$ or less even if a silicide layer is laminated on the polycrystalline silicon layer. In the case of miniaturizing the device to the 0.1 micron generation, since the thickness of the gate electrode must be reduced, the gate electrode is required to have a specific resistance of about 30 $\mu\Omega\cdot$cm or less.

The work functions of the N-type polycrystalline silicon layer and the P-type polycrystalline silicon layer, which are directly in contact with the gate insulating layer, are respectively 4.15 eV and 5.25 eV. The work functions of these layers significantly differ from the center of the bandgap of silicon (4.61 eV). Such a large difference results in an increase in the absolute value of a flat band voltage $V_{FB}$ in a MOS capacitor formed of a metal-insulating layer-semiconductor (signs differ between NMOSFET and PMOSFET). Therefore, in such MOSFETS, an optimum value of the impurity concentration in the channel must be shifted to the high concentration side in order to control a threshold value $V_{TH}$. The channel with high-concentration impurities is significantly influenced by carrier scattering due to impurities. As a result, carrier mobility in the channel decreases. This means a decrease in the current drive capability of the MOSFET, thereby significantly affecting the response characteristics of the circuit.

In order to solve these problems, low-resistance gate electrode materials which do not cause gate depletion to occur and have various work functions have been proposed. For example, a structure using a titanium nitride (TiN) layer is disclosed by Jeong-Mo Hwang, et al. (in *IEDM Technical Digest*, 1992, page 345), and a structure using a beta-tantalum ($\beta$-Ta) layer is disclosed by Ushiki, et al. (in *IEDM Technical Digest*, 1996, page 117).

The following is pointed out for the gate electrode having a TiN layer formed on a gate insulating layer used in the N-type or P-type MOSFET. Since the TiN layer has a relatively high specific resistance of about 200 $\mu\Omega\cdot$cm, a metal (tungsten, for example) layer is laminated on the TiN layer in order to decrease resistance of the gate electrode. The work function of the TiN layer (4.7 to 4.8 eV) is close to the center of the bandgap of silicon (4.61 eV), as reported by Jeong-Mo Hwang, et al., whereby a significant effect is expected in view of the threshold value control.

However, according to this configuration example, since the TiN layer and the tungsten layer are dissolved in a chemical solution such as a hydrogen peroxide aqueous solution and sulfuric acid, it is very difficult to clean the gate electrode layer after etching. Therefore, devices having this structure cannot be fabricated at high yield.

The following is pointed out for the gate electrode having a tantalum layer formed on the gate insulating layer used in the N-type or P-type MOSFET. According to this configuration example, only a beta-tantalum layer exhibiting high resistance as a metal (specific resistance: about 160 $\mu\Omega\cdot$cm) can be deposited as the tantalum layer, whereby the resistance of the gate electrode relatively increases. Moreover, since the work function of the beta-tantalum layer significantly differs from the center of the bandgap of silicon, the threshold value is shifted to the low threshold side, thereby resulting in an imbalance threshold between the NMOSFET and the PMOSFET.

SUMMARY OF THE INVENTION

An object of the present invention is to provide a semiconductor device which exhibits high current drive capability and can be fabricated at high yield, and a method of fabricating the same.

According to a first aspect of the present invention, there is provided a semiconductor device comprising:

first and second impurity diffusion layers which are provided in a semiconductor layer and form a source region and a drain region;

a channel region formed between the first and second impurity diffusion layers;

a gate insulating layer formed at least on the channel region; and a gate electrode formed on the gate insulating layer, wherein the gate electrode includes a tantalum nitride layer formed in a region which is in contact with at least the gate insulating layer, and a tantalum layer formed over the tantalum nitride layer.

The semiconductor device according to the present invention has the following effects.

(1) The gate electrode includes the tantalum nitride layer formed so as to be in contact with the gate insulating layer. The work function of the tantalum nitride layer is approximately 4.5 eV, which is extremely close to the center of the bandgap of silicon. As a result, the absolute value of the flat band voltage in a capacitor consisting of metal-insulating layer-silicon can be decreased. This eliminates the need for increasing the concentration of impurities doped into the channel region in order to obtain an appropriate threshold value. Therefore, a decrease in carrier mobility can be prevented, whereby an insulated gate field effect transistor exhibiting high current drive capability can be obtained at high yield.

(2) As described in the above (1), the work function of the tantalum nitride layer is extremely close to the center of the bandgap of silicon. Because of this, the difference in the absolute values of the flat band voltages between an N-channel insulated gate field effect transistor and a P-channel insulated gate field effect transistor can be significantly reduced in a capacitor consisting of metal-insulating layer-silicon, although the same type of electrode is used for both transistors. As a result, in a complementary semiconductor device including both an N-channel insulated gate field effect transistor and a P-channel insulated gate field effect transistor, the threshold balance between these transistors can be accurately and easily controlled. Moreover, use of the same electrodes reduces the fabrication steps in comparison with the above-described conventional bipolar polysilicon gates. Furthermore, in the case of a complementary semiconductor device using a fully depleted SOI (Silicon On Insulator) structure or SON (Silicon On Nothing) structure, the absolute value of the threshold voltage can be reduced while preventing punch-through from occurring. This leads to advantages in miniaturization and low-voltage drive.

(3) The gate electrode includes at least the tantalum nitride layer, and the polysilicon layer is not in contact with the gate electrode. Therefore, depletion does not occur in the gate electrode. As a result, the gate electrode can prevent effective electric field applied to the channel region from reducing in comparison with the case of using a polysilicon layer. This also prevents a reduction in current drive capability.

(4) The tantalum nitride layer of the gate electrode exhibits higher chemical stability in comparison with a titanium nitride layer and the like. For example, the tantalum nitride layer exhibits excellent resistance to a chemical solution used to clean the gate electrode. As a result, devices can be fabricated at high yield.

(5) The tantalum layer of the gate electrode has lower resistance in comparison with the tantalum nitride layer, whereby conductivity of the gate electrode can be increased. The tantalum layer may be formed of body-centered cubic tantalum. Body-centered cubic tantalum exhibits a higher conductivity than beta-tantalum. Specifically, body-centered cubic tantalum can reduce the resistance of the gate electrode to about one-tenth of that in the case of using of beta-tantalum. Such a body-centered cubic tantalum layer may be heteroepitaxially grown by lattice matching with the tantalum nitride layer.

The present invention has various features as follows. These features also apply to a complementary semiconductor device and a method of fabricating a semiconductor device described later.

(A) The nitrogen/tantalum ratio (x) of the tantalum nitride layer denoted by $TaN_x$ may be 0.25 to 1.0 in view of conductivity and work function. In particular, the nitrogen/tantalum ratio (x) of the tantalum nitride layer denoted by $TaN_x$ can be about 0.5.

(B) The tantalum nitride layer may have a thickness of 1 nm to 50 nm, or 3 nm to 20 nm in view of heteroepitaxial growth of the tantalum layer and the like.

(C) The gate electrode may include a cap layer in the uppermost layer. The cap layer may be formed by using at least one material selected from $TaN_x$, $TaSi_xN_y$, $TiN_x$, $TiAl_xN_y$, Si, and silicide of a transition metal. In the case where the cap layer is a tantalum nitride layer, each layer of the gate electrode can be easily and continuously formed by using the same apparatus (sputtering apparatus, for example).

(D) A silicide layer may be formed in exposed regions of the first and second impurity diffusion layers and on the upper side of the gate electrode. The presence of such a silicide layer increases conductivity of the impurity diffusion layers and the gate electrode.

(E) The semiconductor layer may have an SOI structure or SON structure. Alternatively, the semiconductor layer may be a silicon layer containing impurities at a concentration of $10^{17}$ cm$^{-3}$ or less, having a thickness one-third the gate length or less, and formed on a bulk semiconductor substrate containing impurities at a concentration of more than $10^{17}$ cm$^{-3}$.

The present invention can be suitably applied to a complementary semiconductor device, as described above. Specifically, a complementary semiconductor device according to a second aspect of the present invention comprises:

an N-channel insulated gate field effect transistor and a P-channel insulated gate field effect transistor, wherein each of the N-channel insulated gate field effect transistor and the P-channel insulated gate field effect transistor comprises:

first and second impurity diffusion layers which are provided in a semiconductor layer and form a source region and a drain region;

a channel region formed between the first and second impurity diffusion layers;

a gate insulating layer formed on the channel region; and a gate electrode formed on the gate insulating layer, wherein the gate electrode includes a tantalum nitride layer formed in a region which is in contact with at least the gate insulating layer, and a tantalum layer formed over the tantalum nitride layer.

According to this complementary semiconductor device, since the work function of the tantalum nitride layer is extremely close to the center of the bandgap of silicon, as described above, the absolute value of the flat band voltage can be reduced. This eliminates the need for increasing the concentration of impurities doped into the channel region in order to obtain an appropriate threshold value. Therefore, a decrease in carrier mobility can be prevented, whereby an insulated gate field effect transistor exhibiting high current drive capability can be obtained at high yield. Moreover, the threshold balance between the N-channel insulated gate field effect transistor and the P-channel insulated gate field effect transistor can be accurately and easily controlled although the same type of electrode is used for both transistors. Furthermore, in the case of a complementary semiconductor device using a fully depleted SOI structure or SON structure, the absolute value of the threshold voltage can be reduced while preventing punch-through from occurring. This ensures the achievement of miniaturization and low-voltage drive.

According to a third aspect of the present invention, there is provided a method of fabricating a semiconductor device comprising the steps of:

(a) forming a gate insulating layer on a semiconductor layer;

(b) forming a gate electrode on the gate insulating layer by forming a tantalum nitride layer in a region in contact with at least the gate insulating layer and forming a tantalum layer over the tantalum nitride layer; and (c) introducing impurities into the semiconductor layer to form first and second impurity diffusion layers which form a source region and a drain region.

The tantalum layer can be formed of body-centered cubic tantalum as described above. Body-centered cubic tantalum exhibits a higher conductivity than that of beta-tantalum. Such a body-centered cubic tantalum layer can be heteroepitaxially grown by lattice matching with the tantalum nitride layer.

The method of fabricating a semiconductor device according to the present invention has features as follows. These features also apply to a method of fabricating a complementary semiconductor device described later.

(A) The first and second impurity diffusion layers may be self-alignably formed by using the gate electrode as a mask in the step (c).

(B) The method may further comprise a step (e) in which a side-wall spacer is formed on each side of the gate electrode after the step (c).

(C) A silicide layer may be formed in exposed regions of the first and second impurity diffusion layers after the step (e).

(D) In the step (b), the tantalum nitride layer and the tantalum layer may be formed by sputtering. If the sputtering is carried out in the presence of xenon or krypton gas, the tantalum layer more reliably exhibits a body-centered cubic crystal structure. Moreover, the steps (a) and (b) may be carried out continuously without allowing the deposited films to be exposed to air.

According to a fourth aspect of the present invention, there is provided a method of fabricating a complementary semiconductor device comprising an N-channel insulated gate field effect transistor and a P-channel insulated gate field effect transistor, comprising the steps of:

(a) forming a gate insulating layer on a semiconductor layer;

(b) forming a gate electrode on the gate insulating layer by forming a tantalum nitride layer in a region in contact with at least the gate insulating layer and forming a tantalum layer over the tantalum nitride layer; and (c) introducing impurities into the semiconductor layer to form a source region and a drain region, comprising forming N-type first and second impurity diffusion layers for the N-channel insulated gate field effect transistor, and forming P-type first and second impurity diffusion layers for the P-channel insulated gate field effect transistor.

DETAILED DESCRIPTION OF THE EMBODIMENT

Embodiments of the present invention are described below with reference to the drawings.

First Embodiment (Device)

Figure 1:
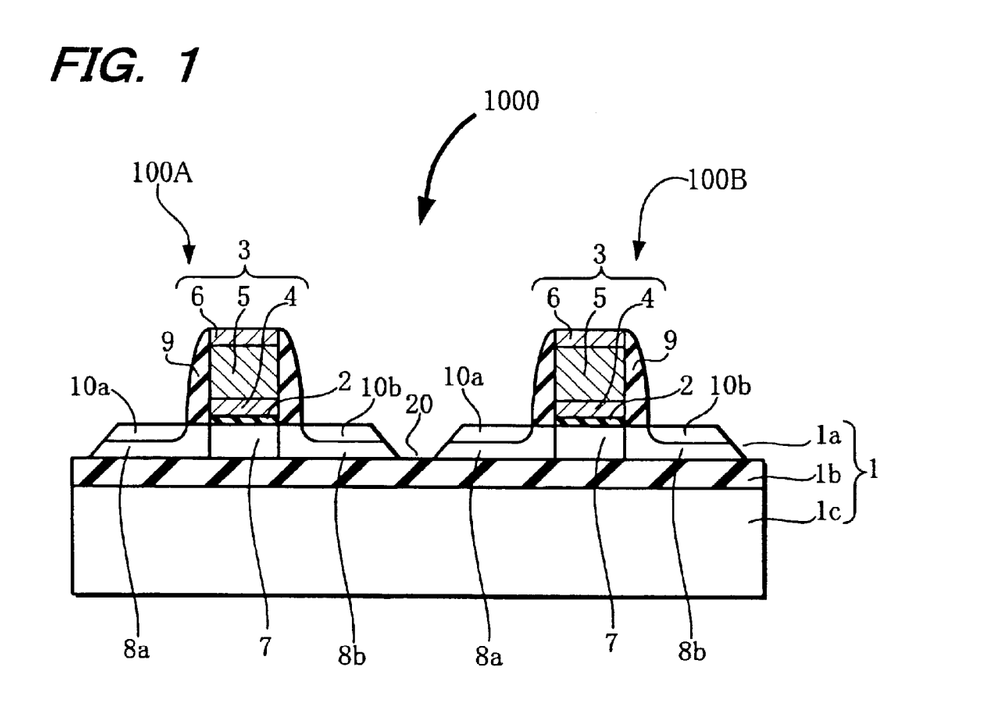
FIG. 1 is a cross-sectional view schematically showing a semiconductor device according to a first embodiment of the present invention.

FIG. 1 is a cross-sectional view schematically showing a semiconductor device 1000 according to a first embodiment of the present invention. The semiconductor device 1000, which is a CMOS semiconductor device, includes an N-channel insulated gate field effect transistor (NMOSFET) 100A and a P-channel insulated gate field effect transistor (PMOSFET) 100B. The NMOSFET 100A and the PMOSFET 100B are formed on an SOI (Silicon On Insulator) substrate 1. The SOI substrate 1 is formed of an insulating layer (silicon oxide layer) 1b and a low-concentration P-type silicon layer 1a laminated on a support substrate 1c. The NMOSFET 100A and the PMOSFET 100B are electrically isolated by a trench 20 formed in the P-type silicon layer 1a of the SOI substrate 1.

Each of the MOSFETs 100A and 100B has a structure in which a stacked gate electrode 3 is formed on the P-type silicon layer 1a through a gate insulating layer 2. Each of the stacked gate electrodes 3 is formed of a tantalum nitride layer 4, a body-centered cubic tantalum layer 5, and a tantalum nitride layer 6 as a cap layer laminated in that order. Channel regions 7 are formed right under the gate insulating layers 2. Impurity diffusion regions 8a and 8b for forming source/drain regions (source region or drain region) are formed on both sides of the channel regions 7.

The impurity diffusion regions 8a and 8b of the NMOSFET 100A are N-type. The impurity diffusion regions 8a and 8b of the PMOSFET 100B are P-type. Silicide layers 10a and 10b are respectively formed on the impurity diffusion regions 8a and 8b.

In the present embodiment, the tantalum nitride layers 4 are formed in a region at least in contact with the gate insulating layers 2. The nitrogen/tantalum ratio (x) of the tantalum nitride layers 4 denoted by $TaN_x$ can be 0.25 to 1.0 in view of conductivity, threshold characteristics, and the like. In the case where the gate electrodes 3 have a stacked structure, the nitrogen/tantalum ratio (x) of the tantalum nitride layers 4 denoted by $TaN_x$ can be about 0.5 in view of the crystal growth of the tantalum layers 5.

Since the gate electrodes 3 include the tantalum nitride layer 6 as a cap layer formed of an oxidation-resistant material in the uppermost layer, the tantalum layer 5 can be prevented from being damaged by oxidation in an oxidation process to be carried out later. Such a cap layer may be formed using at least one material selected from $TaN_x$, $TaSi_xN_y$, $TiN_x$, $TiAl_xN_y$, Si, silicide of a transition metal, and the like.

The semiconductor device according to the present embodiment mainly has the following actions and effects.

(1) The gate electrode 3 includes the tantalum nitride layer 4 formed so as to be in contact with the gate insulating layer 2. The work function of the tantalum nitride layer 4 is approximately 4.5 eV, which is extremely close to the center of the bandgap of silicon. As a result, the absolute value of a flat band voltage in a capacitor consisting of metal-insulating layer-silicon can be decreased. This eliminates the need for increasing the concentration of impurities doped into the channel region in order to obtain an appropriate threshold value. Therefore, a decrease in carrier mobility can be prevented, whereby an MOSFET exhibiting high current drive capability can be obtained at high yield.

(2) The work function of the tantalum nitride layer 4 is extremely close to the center of the bandgap of silicon, as described in the above (1). Because of this, the difference in the absolute values of the flat band voltage between the NMOSFET 100A and the PMOSFET 100B can be significantly decreased although the same type of electrode is used. As a result, the threshold values of the NMOSFET and the PMOSFET in a CMOS can be balanced. Moreover, use of the fully depleted SOI structure can deal with miniaturization and low voltage drive.

(3) The gate electrode 3 is formed of the tantalum nitride layer 4, the tantalum layer 5, and the tantalum nitride layer 6. The polysilicon layer is not in contact with the gate electrode. Therefore, depletion does not occur in the gate electrode. As a result, the gate electrode 3 can provide a lesser decrease in the effective electric field applied to the channel region in comparison with the case of using a polysilicon layer. This also prevents current drive capability from decreasing.

(4) The tantalum nitride layer 4 and the tantalum layer 5 of the gate electrode 3 exhibit higher chemical stability in comparison with a titanium nitride layer and the like. For example, the tantalum nitride layer 4 and the tantalum layer 5 exhibit excellent resistance to a chemical solution used to clean the gate electrode. As a result, devices can be fabricated at high yield.

(5) Since the tantalum layer 5 of the gate electrode 3 is formed of body-centered cubic tantalum, the tantalum layer 5 exhibits higher conductivity in comparison with beta-tantalum. Specifically, body-centered cubic tantalum can decrease the resistance of the gate electrode 3 to about one-tenth of that in the case of using beta-tantalum.

The details of the formation of body-centered cubic tantalum, of which the formation has been difficult, and device characteristic tests of the present invention are described later.

(Fabrication Method)

The method of fabricating the semiconductor device 1000 is described below with reference to FIGS. 2 to 5.

Figure 2:
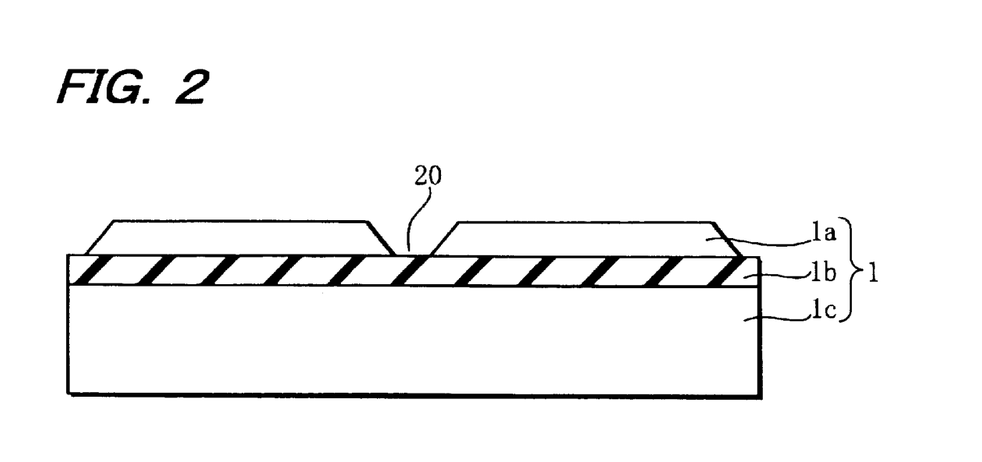
FIG. 2 is a cross-sectional view showing a method of fabricating the semiconductor device according to the first embodiment of the present invention.

(a) A P-type SOI silicon layer 1a (thickness: 50 nm, specific resistance: 14 to 26 $\mu\Omega \cdot cm$, surface orientation (100) is patterned, thereby forming the trench 20 for isolating the elements, as shown in FIG. 2.

Figure 3:
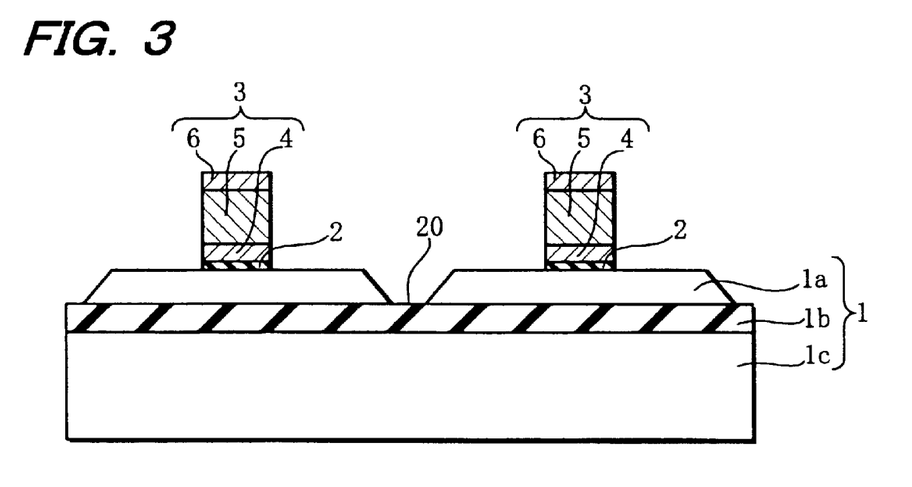
FIG. 3 is a cross-sectional view showing the method of fabricating the semiconductor device according to the first embodiment of the present invention.

(b) The gate insulating layers 2 formed of a silicon oxide layer with a thickness of about 3 nm are formed using a thermal oxidation process, as shown in FIG. 3.

The tantalum nitride layer 4, the body-centered cubic tantalum layer 5, and the tantalum nitride layer 6 as a cap layer are deposited in that order by sputtering using xenon gas, such as reactive sputtering.

Sputtering using xenon with a mass greater than that of conventionally used argon ensures that energy is applied only to the surface of the layer during deposition without causing defects or damage to occur in the underlying gate insulating layers 2 and the silicon layer 1a. Specifically, xenon has an atomic radius of 0.217 nm which is greater than that of argon (0.188 nm). Therefore, xenon is introduced into the layer to a small extent, whereby energy can be applied efficiently only to the surface of the layer. The atomic weight of argon is 39.95, which is close to the atomic weight of silicon. The atomic weight of xenon is 131.3, which is greater than the atomic weight of argon. Because of this, xenon exhibits lower energy/momentum transfer efficiency to the layer in comparison with argon, thereby causing no, or only a small amount of, defects or damage to occur. Therefore, xenon ensures that the tantalum nitride layer 4 and the tantalum layer 5 can be formed without causing defects or damage to occur in the gate insulating layer in comparison with argon. This tendency also applies to krypton.

In the present embodiment, the body-centered cubic tantalum layer 5 with low resistance can be heteroepitaxially grown on the tantalum nitride layer 4 by lattice matching by employing the above deposition method. The thickness of the tantalum nitride layer 4 can be 1 nm to 50 nm in view of the heteroepitaxial growth of the tantalum layer 5, conductivity of the gate electrode 3, and the like. The tantalum nitride layer 6 in the upper layer functions as a cap layer for preventing oxidation to occur in a process after etching the gate electrode.

The tantalum nitride layer 4, the body-centered cubic tantalum layer 5, and the tantalum nitride layer 6 can be formed continuously without being exposed to air. If the film is exposed to air during deposition, moisture may adhere to the film or an oxide may be formed on the surface of the film.

The gate electrode is then patterned using a lithographic technique and dry etching technique.

Figure 4:
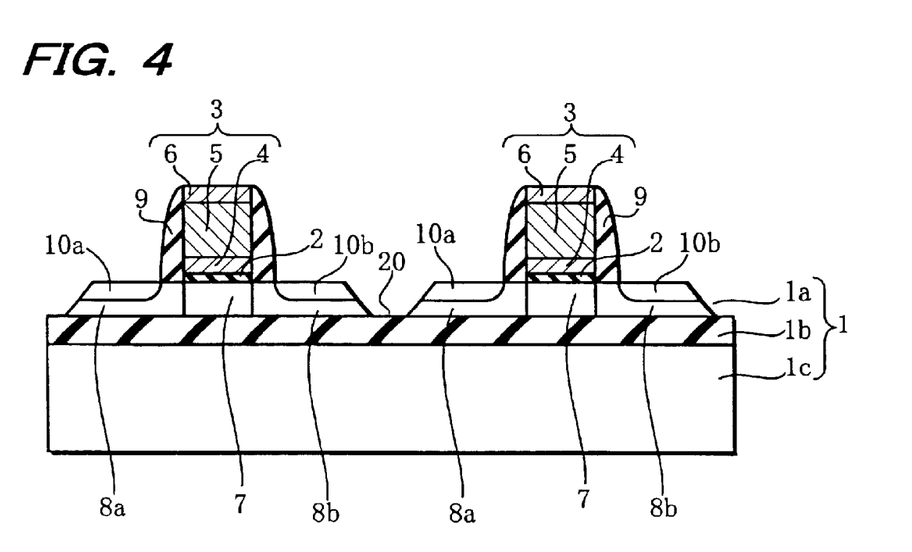
FIG. 4 is a cross-sectional view showing the method of fabricating the semiconductor device according to the first embodiment of the present invention.

(c) An arsenic ion ($As^+$) and a boron difluoride ion ($BF_2^+$) are respectively implanted into the NMOSFET and the PMOSFET at a concentration of $10^{20}$ $cm^{-3}$ or more using the gate electrode 3 as a mask, as shown in FIG. 4. When forming impurity diffusion layers of the NMOSFET and the PMOSFET, a mask layer (not shown) such as a resist layer is formed in a predetermined region so that an impurity ion with a reversed polarity is not doped.

Impurity diffusion layers 8a and 8b can be self-alignably formed by low-temperature annealing at 700° C. or less, or 450 to 550° C.

Then, a silicon oxide layer is deposited over the entire surface of the SOI substrate 1 on which the gate electrodes 3 are formed using a CVD (Chemical Vapor Deposition) process. The silicon oxide layer is etched back using a dry etching process, thereby forming side-wall spacers 9.

A transition metal layer such as an Ni layer is deposited using a sputtering process and then annealed, thereby forming nickel silicide layers 10a and 10b on the exposed area of the impurity diffusion layers 8a and 8b. A metal such as titanium (Ti) or cobalt (Co) may be used as the transition metal without specific limitations insofar as the silicide can be formed. Unreacted transition metal layers on the sidewall spacers 9 are removed using an acid such as sulfuric acid, thereby self-alignably forming the silicide layers 10a and 10b.

Figure 5:
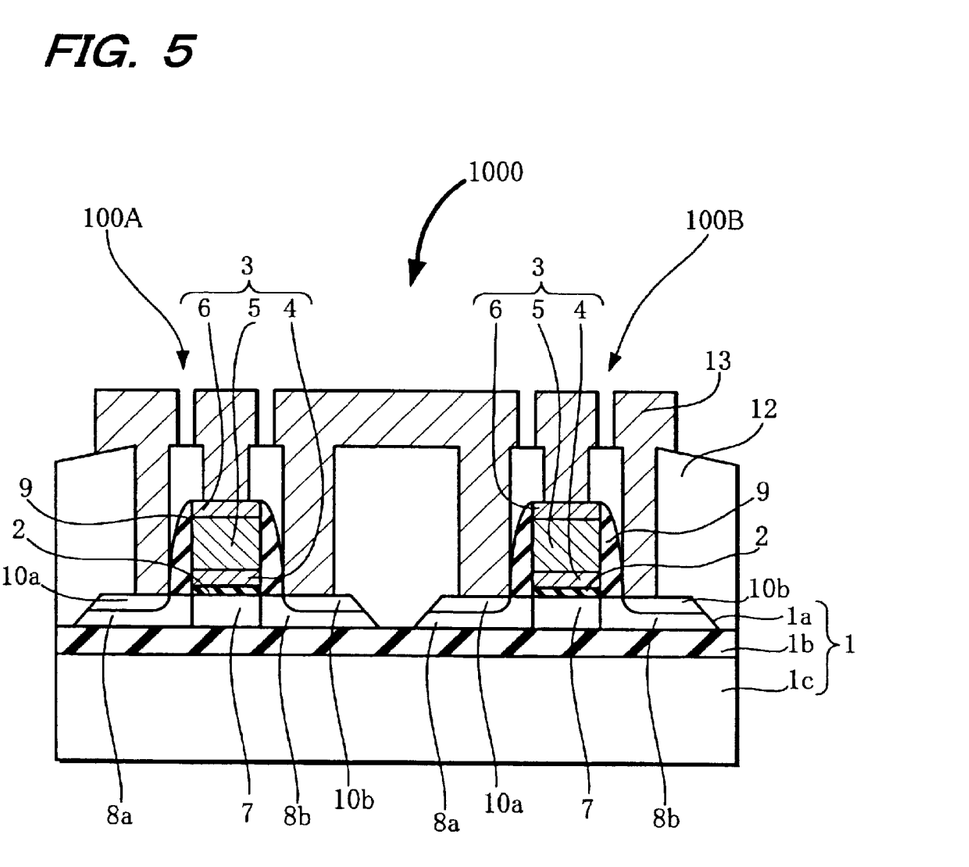
FIG. 5 is a cross-sectional view showing the method of fabricating the semiconductor device according to the first embodiment of the present invention.

(d) An interlayer dielectric 12 and a wiring layer 13 are then formed by a wiring step using conventional CMOS process technology to obtain the semiconductor device 1000.

According to this fabrication method, the body-centered cubic tantalum layer 5 can be heteroepitaxially formed on the tantalum nitride layer 4 using sputtering by forming the tantalum nitride layer 4 in a region at least in contact with the gate insulating layer 2.

(Crystal Structure and Characteristic Test)

The crystal structure of the semiconductor device according to the present invention, specifically, heteroepitaxial technology of the gate electrodes by lattice matching is described below. Characteristic tests determined for the semiconductor device according to the present invention and a semiconductor device for comparison are also described below. Samples used for the analysis of the crystal structure and for the characteristic tests are as follows.

Sample of the present invention:

A CMOS semiconductor device is formed on the SOI substrate 1 of which the thickness of the P-type silicon layer 1a is 57 nm. The gate insulating layer 2 of the CMOS semiconductor device is formed of a silicon oxide layer with a thickness of 3.8 nm or 5.5 nm. The gate electrode 3 includes the tantalum nitride layer 4 with a thickness of 5 nm formed on the gate insulating layer 2 and the body-centered cubic tantalum layer 5 with a thickness of 158 nm. As a sample for determining capacitance of the MOS, a CMOS semiconductor device in which a silicon oxide layer with a thickness of 11.5 nm is formed on a bulk layer formed of P-type silicon instead of the gate insulating layer, and a tantalum nitride layer and a body-centered cubic tantalum layer each having the same thickness as that of the above gate electrode was used.

Sample for comparison:

The sample for comparison has a structure similar to that of the sample of the present invention except that the gate electrode includes a beta-tantalum layer instead of the tantalum nitride layer.

(1) Crystal structure

Figure 6:
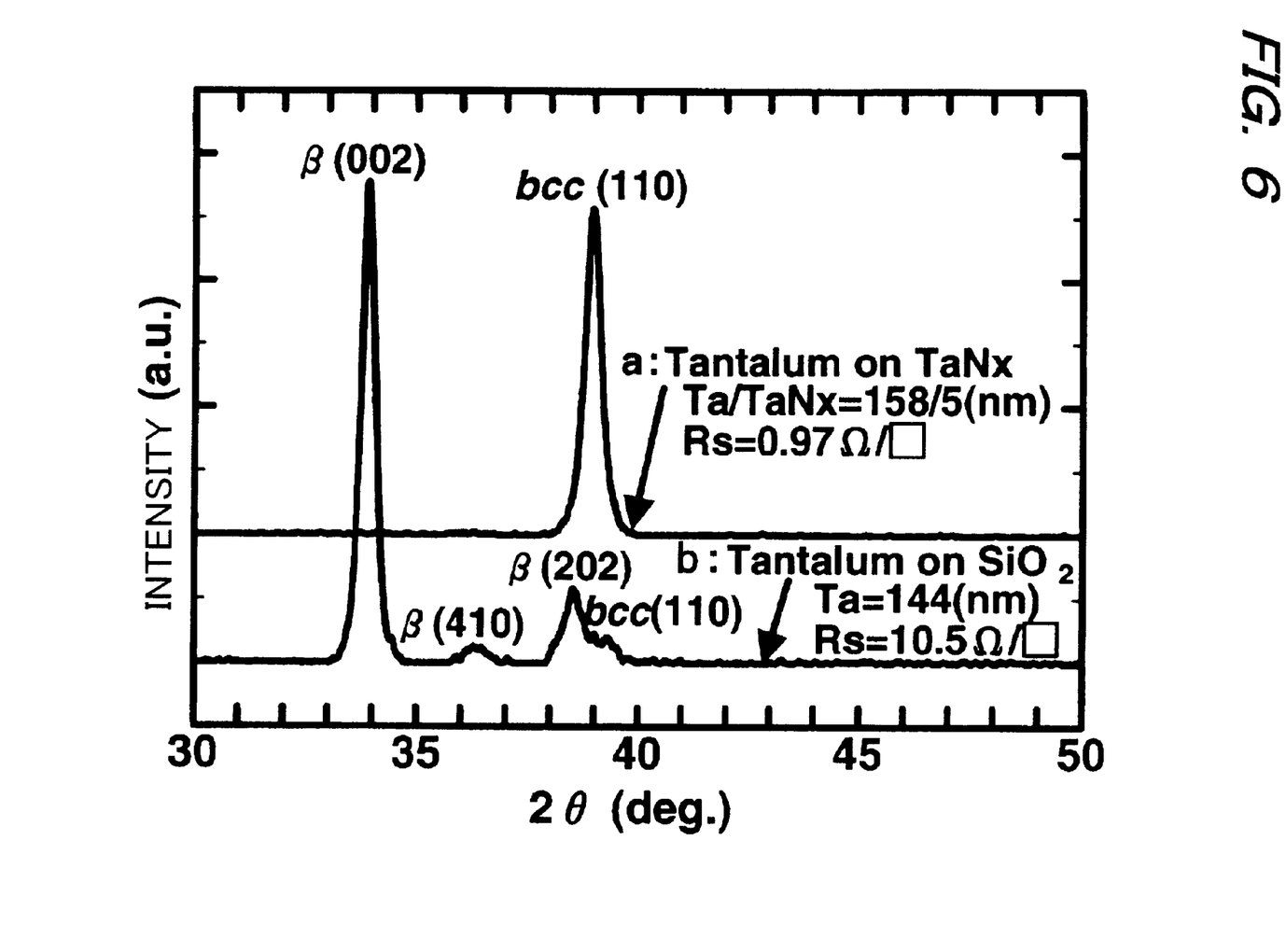
FIG. 6 shows an X-ray diffraction spectrum of a gate structure determined for a sample of the present invention and a sample for comparison.

FIG. 6 shows diffraction peaks of the tantalum layers of the sample of the present invention and the sample for comparison using an X-ray diffraction method. In FIG. 6, the horizontal axis shows diffraction angle and the vertical axis shows intensity. In FIG. 6, a line indicated by "a" shows the results for the sample of the present invention. A line indicated by "b" shows the results for the sample for comparison.

As is clear from FIG. 6, high-resistance beta-tantalum is grown on the $SiO_2$ layer (gate insulating layer) in the sample for the comparison. On the contrary, body-centered cubic (bcc) alpha-tantalum with low resistance is grown on the tantalum nitride layer in the sample of the present invention, on which beta-tantalum is not grown.

This gives rise to the assumption that the growth of the tantalum layer is influenced by the underlying layer. Table 1 shows the lattice constant (d), surface orientation (hkl), and diffraction angle (2θ) of tantalum and tantalum nitride. As is clear from Table 1, the surface (110) of body-centered cubic alpha-tantalum (bcc-Ta) and the surface (101) of ditantalum nitride ($TaN_{0.5}$) have very close lattice constants. Mismatch of the lattice constants between these surfaces is only about 0.68%.

TABLE 1

|  | (hkl) | d (nm) | 2 θ (deg) |
|---|---|---|---|
| β - Ta | (002) | 0.2658 | 33.69 |
| β - Ta | (410) | 0.2474 | 33.28 |
| β - Ta | (202) | 0.2354 | 38.20 |
| bcc - Ta | (110) | 0.2338 | 38.47 |
| $Ta_2N$ | (101) | 0.2323 | 38.73 |
| TaN | (200) | 0.2169 | 41.60 |

Figure 7:
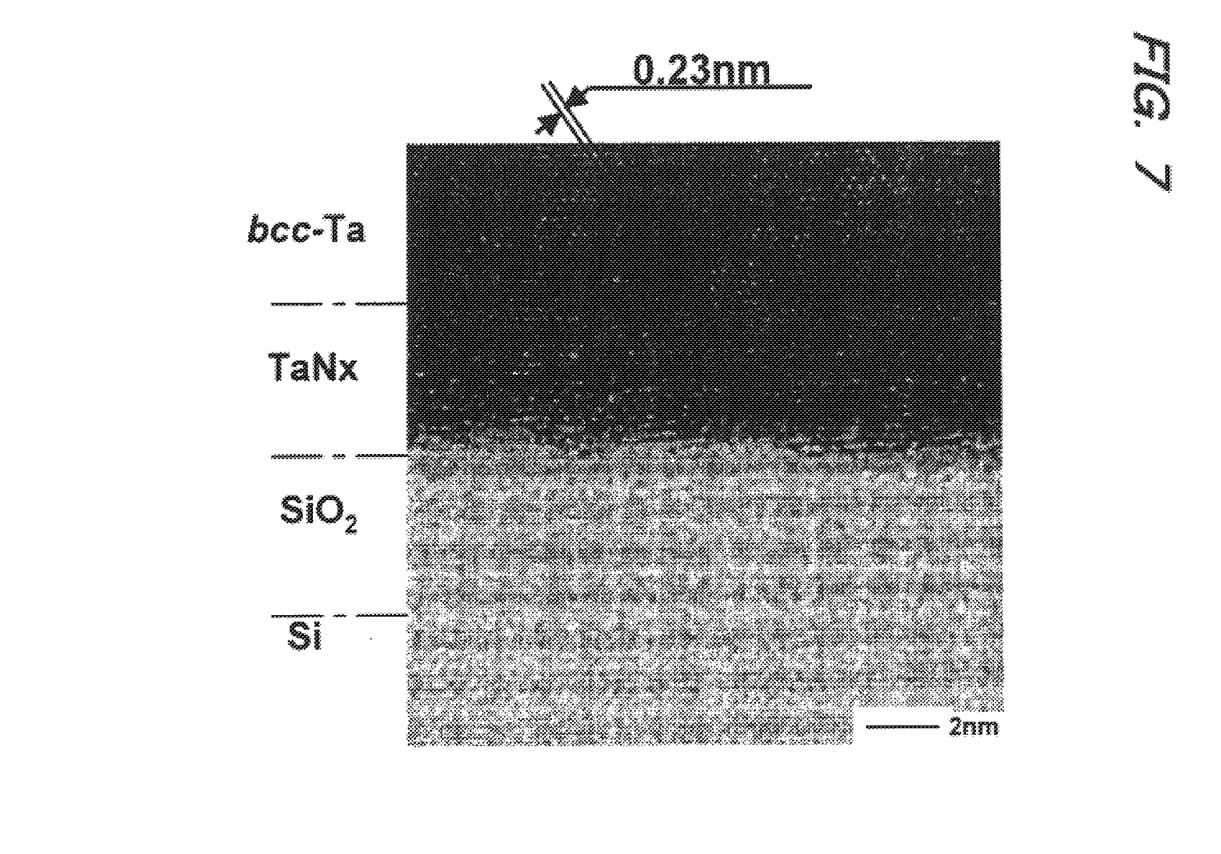
FIG. 7 is an electron microscope photograph showing a cross-sectional structure of the sample of the present invention.

As a result of cross-sectional observation of the interface between tantalum nitride and alpha-tantalum deposited thereon using a transmission electron microscope, the lattice constants of both layers were found to be about 0.23 nm, which is approximately the same as the values shown in Table 1. FIG. 7 shows a cross-sectional photograph taken using a transmission electron microscope.

As described above, body-centered cubic alpha-tantalum (bcc-Ta) is heteroepitaxially grown on ditantalum nitride ($TaN_{0.5}$) by lattice matching in the sample of the present invention. On the contrary, beta-tantalum layer is formed on the gate insulating layer (silicon oxide layer) in the sample for comparison.

(2) Quasi-static C-V characteristics

Figure 8:
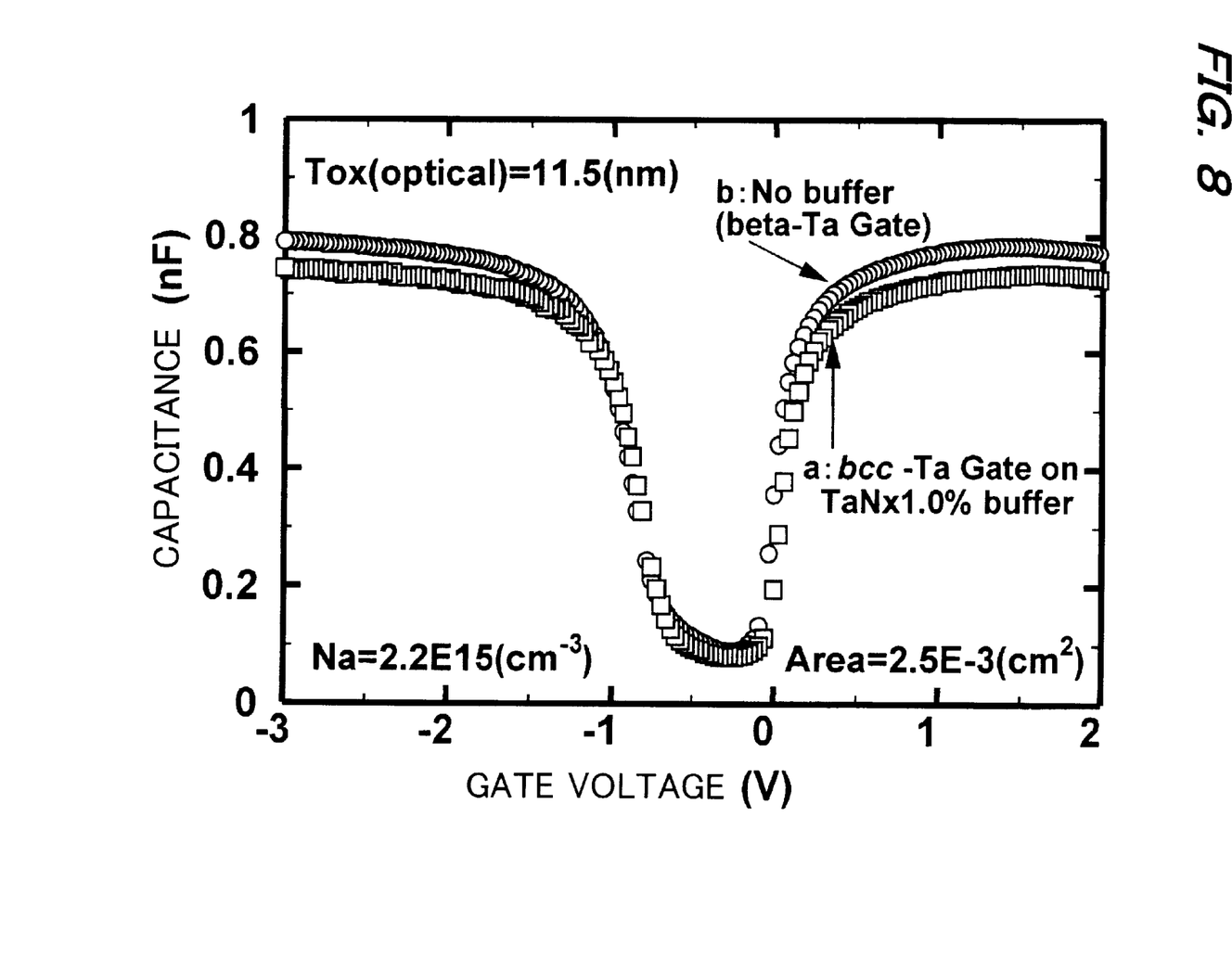
FIG. 8 shows the relationship between a gate voltage and capacitance determined for the sample of the present invention and the sample for comparison.

The quasi-static C-V characteristics were determined for the sample of the present invention and the sample for comparison. The results are shown in FIG. 8. In FIG. 8, the horizontal axis shows gate voltage and the vertical axis shows capacitance. In FIG. 8, a line indicated by "a" shows the results for the sample of the present invention. A line indicated by "b" shows the results for the sample for comparison.

As is clear from FIG. 8, since the capacitance is approximately symmetrical with respect to the gate voltage "0", depletion does not occur in the gate electrodes of either sample. Secondly, the capacitance of the sample of the present invention is lower than that of the sample for comparison throughout. This indicates that beta-tantalum reacts with the gate insulating layer in the sample for comparison, thereby forming a reaction layer. Therefore, in the sample of the present invention, the gate electrode, in particular, the tantalum nitride layer exhibits higher chemical stability in comparison with the sample for comparison, thereby preventing the capacitance from increasing.

(3) Electron barrier height at the interface between gate electrode (tantalum nitride layer) and gate insulating layer.

Figure 9:
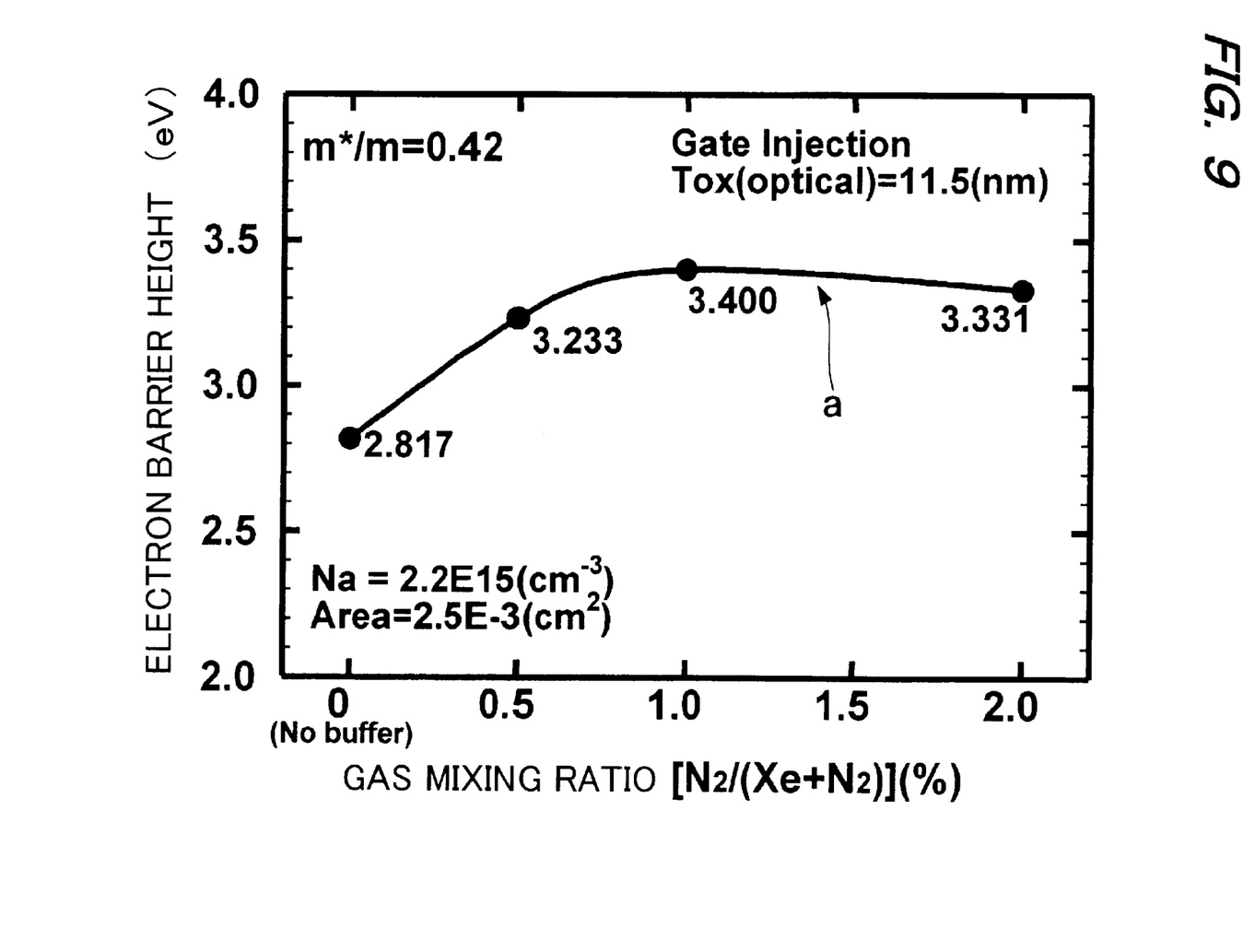
FIG. 9 shows the relationship between a gas mixing ratio at the time of depositing a tantalum nitride layer and an electron barrier height between a gate electrode and a gate insulating layer determined for the sample of the present invention and the sample for comparison.

The electron barrier height at the interface between the gate electrode and the gate insulating layer relative to the nitrogen gas mixing ratio (nitrogen/(xenon+nitrogen)) at the time of depositing the tantalum nitride layer of the gate electrode by sputtering was determined. The results are indicated by "a" in FIG. 9. In FIG. 9, the horizontal axis shows gas mixing ratio and the vertical axis shows electron barrier height.

As shown by the line indicated by "a" in FIG. 9, the electron barrier height increases as the ratio of nitrogen at the time of sputtering increases. The electron barrier height peaks when the mixing ratio is about 1 vol %. As is clear from the line indicated by "a", the work function of the tantalum nitride layer increases by increasing the nitrogen gas mixing ratio to at least about 1 vol %.

(4) Gate length-threshold voltage characteristics

Figure 10:
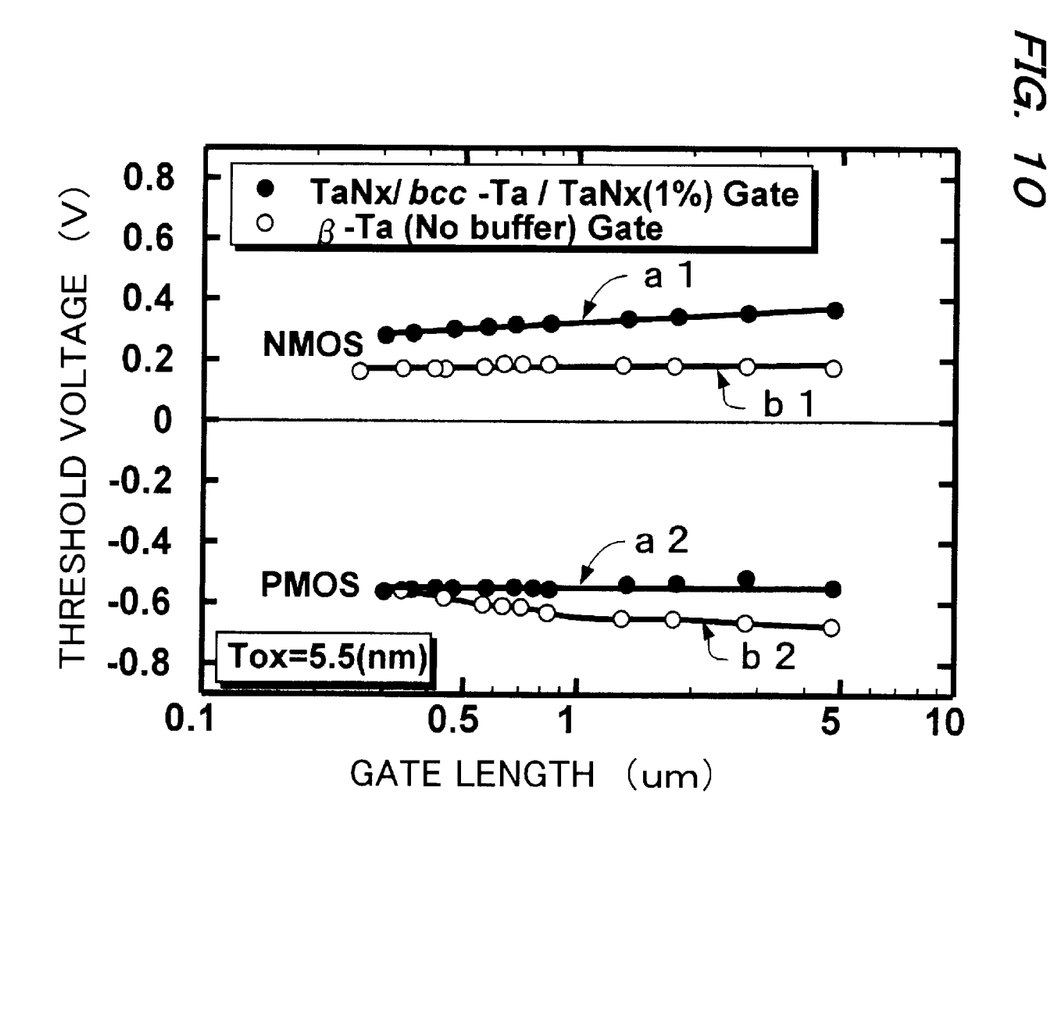
FIG. 10 shows the relationship between a gate length and a threshold voltage determined for the sample of the present invention and the sample for comparison.

Changes in the threshold voltage relative to the gate length were determined for the sample of the present invention and the sample for comparison. The results are shown in FIG. 10. In FIG. 10, the horizontal axis shows gate length and the vertical axis shows threshold voltage. In FIG. 10, the results for the sample of the present invention are indicated by "a1" and "a2". The results for the sample for comparison are indicated by "b1" and "b2". The symbols "a1" and "b1" indicate the results for the NMOSFET, and the symbols "a2" and "b2" indicate the results for the PMOSFET.

As is clear from FIG. 10, in the sample of the present invention, the threshold voltage increases throughout in both the NMOSFET and the PMOSFET in comparison with the sample for comparison, whereby symmetricalness of the threshold voltage is improved. This indicates that the work function of the tantalum nitride layer is closer to the center of the bandgap of silicon in comparison with that of the beta-tantalum layer.

Second Embodiment (Device)

A semiconductor device 2000 according to a second embodiment of the present invention and a method of fabricating the same are described below with reference to FIGS. 11 to 14. The present embodiment differs from the first embodiment in that the cap layer for preventing oxidation of the gate electrode is formed of a silicide layer 15 of an amorphous or polycrystalline silicon layer instead of the tantalum nitride layer. In the semiconductor device 2000, sections substantially the same as those of the semiconductor device 1000 are indicated by the same symbols. Detailed description of these sections is omitted.

Figure 14:
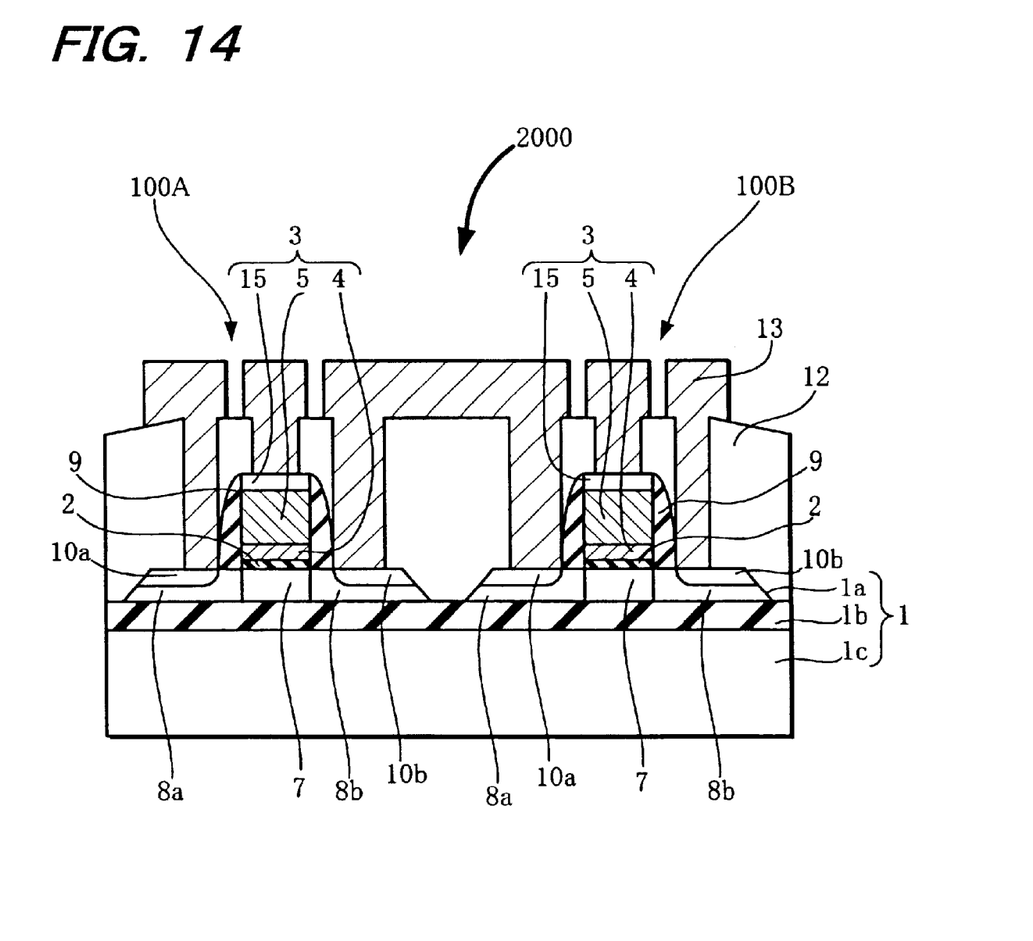
FIG. 14 is a cross-sectional view showing the method of fabricating a semiconductor device and the semiconductor device according to the second embodiment of the present invention.

In the present embodiment, the gate electrode 3 includes the tantalum nitride layer 4 which is in contact with the gate insulating layer 2, the body-centered cubic tantalum layer 5, and the silicide layer 15 of an amorphous or polycrystalline silicon layer.

The semiconductor device 2000 of the present embodiment has the following action and effect in addition to those of the semiconductor device 1000 of the first embodiment. Specifically, according to the semiconductor device 2000, conductivity of the gate electrode 3 further increases by forming the cap layer using the silicide layer 15.

(Fabrication Method)

The method of fabricating the semiconductor device 2000 is described below with reference to FIGS. 11 to 14.

Figure 11:
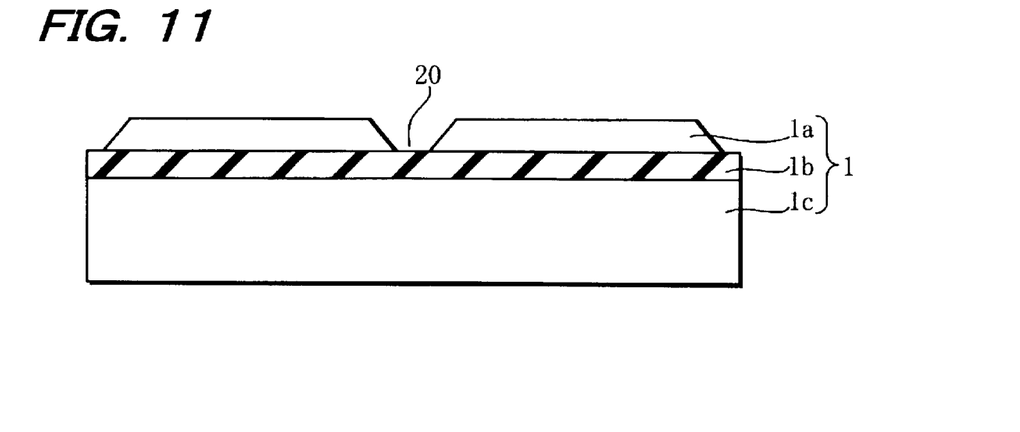
FIG. 11 is a cross-sectional view showing a method of fabricating a semiconductor device according to a second embodiment of the present invention.

(a) A P-type SOI silicon layer 1a (thickness: 50 nm, specific resistance: 14 to 26 $\mu\Omega$·cm, surface orientation (100) is patterned, thereby forming the trench 20 for isolating the elements, as shown in FIG. 11.

Figure 12:
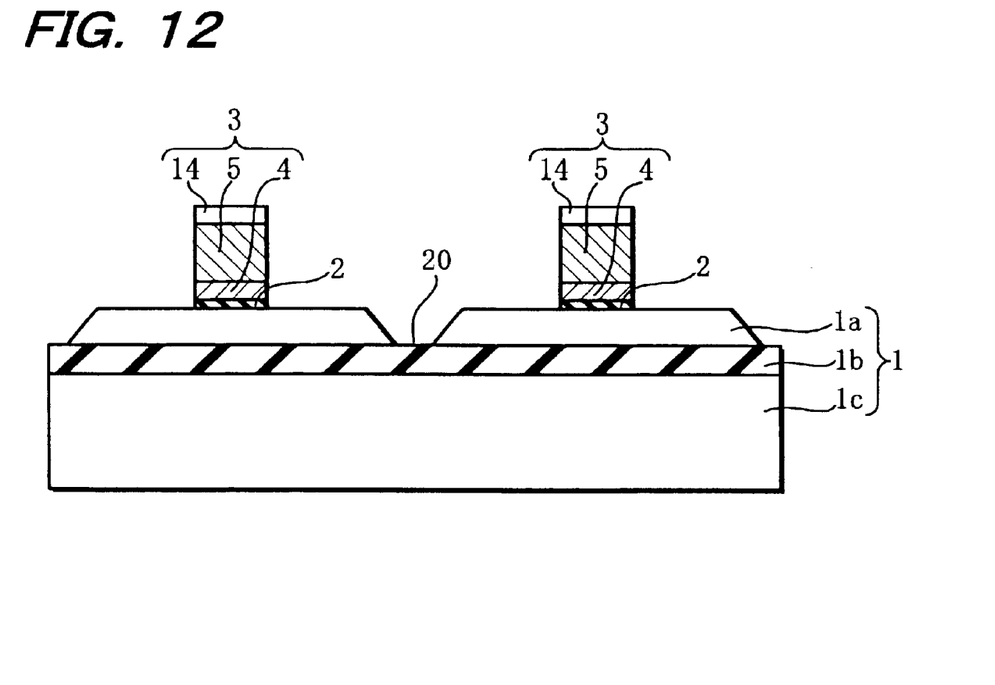
FIG. 12 is a cross-sectional view showing the method of fabricating a semiconductor device according to the second embodiment of the present invention.

(b) The gate insulating layers 2 formed of a silicon oxide layer with a thickness of about 3 nm are formed using a thermal oxidation process, as shown in FIG. 12.

The tantalum nitride layer 4, the body-centered cubic tantalum layer 5, and an amorphous or polycrystalline silicon layer 14 are deposited in that order by sputtering using xenon gas, such as reactive sputtering.

Sputtering using xenon gas with a mass greater than that of conventionally used argon ensures that energy is applied only to the surface of the layer during deposition without causing defects or damage to occur in the underlying gate insulating layer 2 and the silicon layer 1a in the same manner as in the first embodiment.

The tantalum nitride layer 4, the body-centered cubic tantalum layer 5, and the amorphous or polycrystalline silicon layer 14 can be formed continuously without allowing these layers to be exposed to air. If the film is exposed to air during deposition, moisture may adhere to the film or oxide may be formed on the surface of the film.

The low-resistance body-centered cubic tantalum layer 5 is heteroepitaxially grown on the tantalum nitride 4 by lattice matching in the same manner as in the first embodiment. The silicon layer 14 in the upper layer is silicided in a process described later, whereby the silicon layer 14 functions as a cap layer for preventing oxidation of the tantalum layer 5.

The gate electrode is then patterned using a lithographic technique and a dry etching technique.

Figure 13:
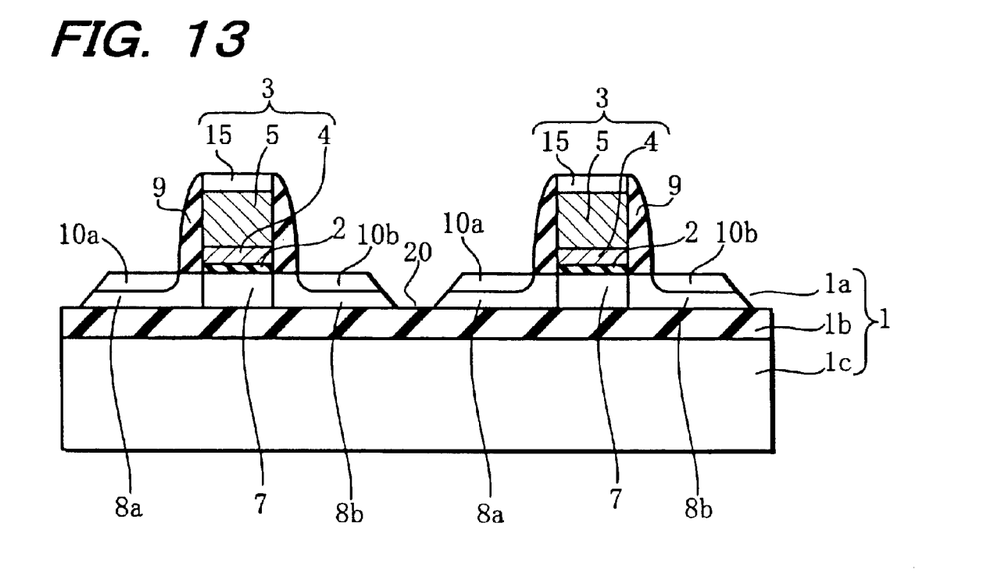
FIG. 13 is a cross-sectional view showing the method of fabricating a semiconductor device according to the second embodiment of the present invention.

(c) An arsenic ion ($As^+$) and a boron difluoride ion ($BF_2^+$) are respectively implanted into the NMOSFET and the PMOSFET at a concentration of $10^{20}$ $cm^{-3}$ or more using the gate electrode 3 as a mask, as shown in FIG. 13. When forming the impurity diffusion layers of the NMOSFET and the PMOSFET, a mask layer (not shown) such as a resist layer is formed in a predetermined region so that an impurity ion with a reversed polarity is not doped.

Impurity diffusion layers 8a and 8b can be self-alignably formed by low-temperature annealing at 700° C. or less, or 450 to 550° C. Then, a silicon oxide layer is deposited over the entire surface of the SOI substrate 1 on which the gate electrodes 3 are formed using a CVD (Chemical Vapor Deposition) process. The silicon oxide layer is etched back using a dry etching process, thereby forming side-wall spacers 9.

A transition metal layer such as an Ni layer is deposited using a sputtering process and then annealed, thereby forming nickel silicide layers 10a, 10b, and 15 on the exposed area of the impurity diffusion layers 8a and 8b and the silicon layer 14. Unreacted transition metal layers on the side-wall spacers 9 are removed using an acid such as sulfuric acid, thereby self-alignably forming the silicide layers 10a, 10b, and 15.

(d) An interlayer dielectric 12 and a wiring layer 13 are then formed by a wiring step using conventional CMOS process technology to obtain the semiconductor device 2000.

The embodiments of the present invention are described above. The present invention may be embodied in various ways within the scope of the present invention. The gate insulating film is formed using a thermally oxidized silicon film. Alternatively, a silicon nitride film or the like may be used.

What is claimed is:

1. A semiconductor device, comprising:

first and second impurity diffusion layers which are provided in a semiconductor layer and form a source region and a drain region;

a channel region formed between the first and second impurity diffusion layers;

a gate insulating layer formed at least on the channel region; and a gate electrode formed on the gate insulating layer, wherein the gate electrode includes:

a tantalum nitride layer formed in a region which is in contact with at least the gate insulating layer, wherein the tantalum nitride layer has a thickness of 3 nm to 20 nm, and a body center cubic tantalum layer heteroepitaxially formed over the tantalum nitride layer by lattice matching.

2. The semiconductor device as defined in claim 1, wherein the nitrogen/tantalum ratio (x) of the tantalum nitride layer denoted by $TaN_x$ is 0.25 to 1.0.

3. The semiconductor device as defined in claim 2, wherein the nitrogen/tantalum ratio (x) of the tantalum nitride layer denoted by $TaN_x$ is about 0.5.

4. The semiconductor device as defined in claim 1, wherein the gate electrode includes a cap layer in the uppermost layer.

5. The semiconductor device as defined in claim 4, wherein the cap layer is formed of at least one material selected from $TaN_x$, $TaSi_xN_y$, $TiN_x$, $TiAl_xN_y$, Si, and silicide of a transition metal.

6. The complementary semiconductor device as defined in claim 5, wherein the cap layer is formed of the tantalum nitride layer.

7. The semiconductor device as defined in claim 1, wherein a suicide layer is formed in part of the first and second impurity diffusion layers.

8. The semiconductor device as defined in claim 1, wherein the semiconductor layer has a silicon-on-insulator (SOI) structure or a silicon-on-nothing (SON) structure.

9. A complementary semiconductor device, comprising:
an N-channel insulated gate field effect transistor and a P-channel insulated gate field effect transistor,
wherein each of the N-channel insulated gate field effect transistor and the P-channel insulated gate field effect transistor comprises:
first and second impurity diffusion layers which are provided in a semiconductor layer and form a source region and a drain region;
a channel region formed between the first and second impurity diffusion layers;
a gate insulating layer formed on the channel region; and
a gate electrode formed on the gate insulating layer, wherein the gate electrode includes:
a tantalum nitride layer formed in a region which is in contact with at least the gate insulating layer, wherein the tantalum nitride layer has a thickness of 3 nm to 20 nm, and
a body-centered cubic tantalum layer heteroepitaxially formed over the tantalum nitride layer by lattice matching.

10. The complementary semiconductor device as defined in claim 9, therein the nitrogen/tantalum ratio (x) of the tantalum nitride layer denoted by $TaN_x$ is 0.25 to 1.0.

11. The complementary semiconductor device as defined in claim 10, wherein the nitrogen/tantalum ratio (x) of the tantalum nitride layer denoted by $TaN_x$ is about 0.5.

12. The complementary semiconductor device as defined in claim 9, therein the gate electrode comprises a cap layer in the uppermost layer.

13. The complementary semiconductor device as defined in claim 12, wherein the cap layer is formed of at least one material selected from $TaN_x$, $TaSi_xN_y$, $TiN_x$, $TiAl_xN_y$, Si, and silicide of a transition metal.

14. The complementary semiconductor device as defined in claim 13, wherein the cap layer is formed of the tantalum nitride layer.

15. The complementary semiconductor device as defined in claim 9, wherein a silicide layer is formed in part of the first and second impurity diffusion layers.

16. The complementary semiconductor device as defined in claim 9, wherein the semiconductor layer has a silicon-on-insulator (SOI) structure or a silicon-on-nothing (SON) structure.

* * * * *